(12) United States Patent
Lammer-Pachlinger et al.

(10) Patent No.: US 7,084,411 B2
(45) Date of Patent: Aug. 1, 2006

(54) PATTERN-DEFINITION DEVICE FOR MASKLESS PARTICLE-BEAM EXPOSURE APPARATUS

(75) Inventors: Wolfgang Lammer-Pachlinger, Vienna (AT); Gertraud Lammer, Vienna (AT); Alfred Chalupka, Vienna (AT)

(73) Assignee: IMS Nanofabrication GmbH, Vienna (AT)

( * ) Notice: Subject to any disclaimer, the term of this patent is extended or adjusted under 35 U.S.C. 154(b) by 99 days.

(21) Appl. No.: 10/974,276

(22) Filed: Oct. 27, 2004

(65) Prior Publication Data

US 2005/0087701 A1    Apr. 28, 2005

(30) Foreign Application Priority Data

Oct. 28, 2003  (AT) .............................. A 1711/2003

(51) Int. Cl.
*H01J 37/08* (2006.01)
(52) U.S. Cl. .............................. 250/492.1; 250/492.22; 250/492.23; 250/492.3; 250/398
(58) Field of Classification Search ...................... None
See application file for complete search history.

(56) References Cited

U.S. PATENT DOCUMENTS

| | | | |
|---|---|---|---|
| 4,985,634 A | 1/1991 | Stengl et al. | |
| 5,369,282 A | 11/1994 | Arai et al. | |
| 5,981,962 A | 11/1999 | Groves et al. | |
| 6,768,125 B1 | 7/2004 | Platzgummer et al. | |
| 6,943,351 B1 * | 9/2005 | Parker et al. ............. | 250/310 |
| 2001/0054690 A1 | 12/2001 | Shimada et al. | |

FOREIGN PATENT DOCUMENTS

GB      2 367 689 A      10/2002

OTHER PUBLICATIONS

Berry, I.L. et al.; "Programmable Aperture Plate for Maskless High-Throughput Nanolithography"; J. Vax. Sci. Technol. B 15(6); pp. 2382-2386; Nov./Dec. 1997; American Vacuum Society.

Muraki, M. et al.; "New Concept for High-Throughput Multielectron Beam Direct Write System"; J. Vac. Sci. Technol. B 18(6), pp. 3061-3066; Nov./Dec. 2000; American Vacuum Society.

* cited by examiner

*Primary Examiner*—Nikita Wells
*Assistant Examiner*—Zia R. Hashmi
(74) *Attorney, Agent, or Firm*—RatnerPrestia

(57) ABSTRACT

In a pattern-definition device (102) for use in a particle-beam exposure apparatus, a beam of electrically charged particles is patterned through a plurality of apertures. The device comprises at least one deflector array means having a plurality of openings surrounding the beamlets, wherein for each opening are provided at least two deflecting electrodes to which different electrostatic potentials are applicable, thus correcting the path of the beamlet(s) passing through the respective opening according to a desired path through the device (102). According to a partition of the plurality of apertures into a set of subfields ($A_{ij}$), the deflecting electrodes belonging to the same subfield ($A_{ij}$) have common electric supplies. Thus, the electrostatic potentials of the deflecting electrodes belonging to the same subfield ($A_{ij}$) are constant or linearly interpolated between basic potentials fed at basic points ($P_{ij}$) of the respective subfield.

19 Claims, 12 Drawing Sheets

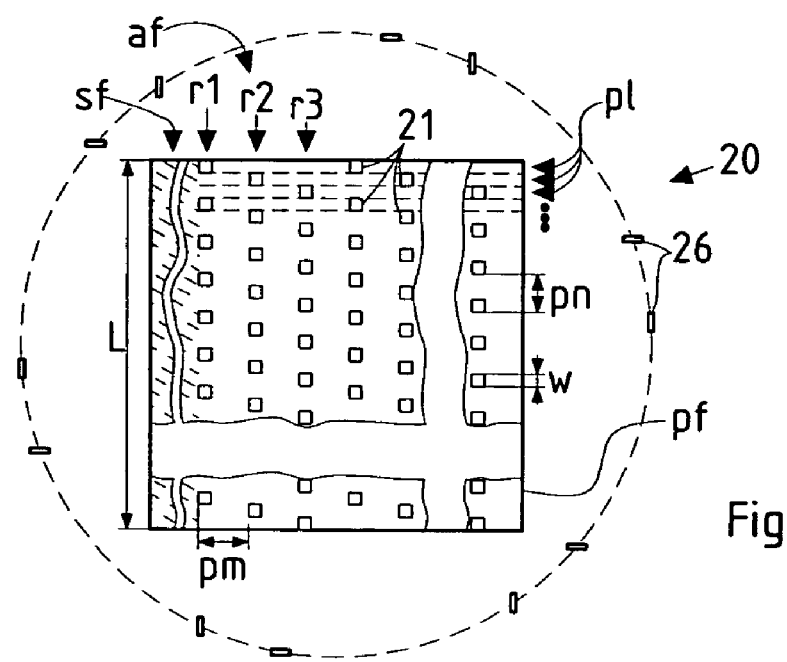
Fig. 2
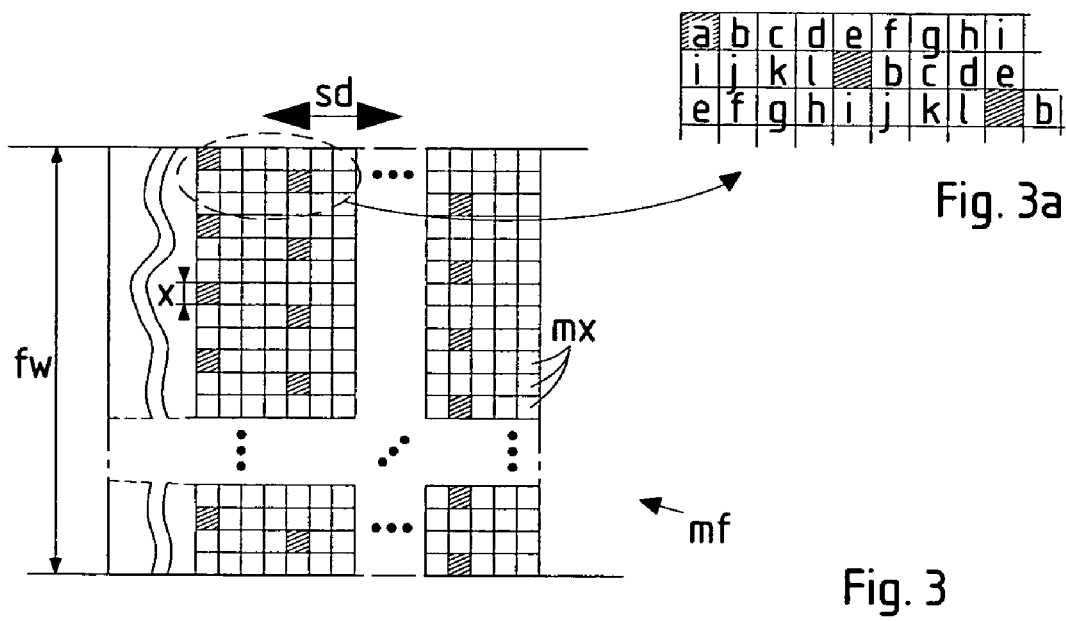
Fig. 3a
Fig. 3

PATTERN-DEFINITION DEVICE FOR MASKLESS PARTICLE-BEAM EXPOSURE APPARATUS

CROSS-REFERENCE TO RELATED APPLICATIONS

This application claims the benefit of Austrian Patent Application Serial No. A 1711/2003, filed 28 Oct. 2003.

FIELD OF THE INVENTION AND DESCRIPTION OF PRIOR ART

The invention relates to a pattern definition device and an exposure apparatus employing this pattern definition means. The pattern definition device is used in a maskless particle-beam exposure apparatus for forming a pattern on a surface of a substrate by means of a beam of energetic electrically charged particles. More in detail, the pattern definition device is a means for defining a pattern in a particle-beam exposure apparatus, which device is adapted to be irradiated with a beam of electrically charged particles and allow the passage of the beam only through a plurality of apertures. It comprises an aperture array means which has a plurality of apertures defining the shape of beamlets permeating said apertures, as well as at least one deflector array means separate from the aperture array means, with said deflector array means having a plurality of openings surrounding the beamlets; at least two deflecting electrodes to which different electrostatic potentials are applicable are provided for each opening, thus correcting the path of the beamlet(s) passing through the respective opening according to a desired path through the device.

In other words, the particle beam is generated by an illumination system and illuminates a pattern definition (PD) means having an array of apertures The beam permeating the aperture array forms a patterned particle beam bearing a pattern information as represented by the spatial arrangement of the apertures. The patterned beam is then projected by means of a particle-optical projection system onto the substrate where an image of the apertures is thus formed.

One important application of exposure apparatus of this kind is in the field of particle-beam lithography used in semiconductor technology, as a lithography apparatus. In order to define a desired pattern on a substrate surface, such as a circuit layer to be defined on a silicon wafer, the wafer is covered with a layer of a radiation-sensitive photoresist. Then the desired structure is imaged onto the photoresist by means of a lithography apparatus. The photoresist thus patterned is partially removed according to the pattern defined by the previous exposure step, and is now used as a mask for further structuring processes such as etching. By repeating this scheme, complicated minute structures such as an integrated circuits can be formed.

Arai et al., U.S. Pat. No. 5,369,282, discuss an electron-beam exposure system using a so-called blanking aperture array (BAA) which plays the role of the pattern definition means. The BAA carries a number of rows of apertures, and the images of the apertures are scanned over the surface of the substrate in a controlled continuous motion whose direction is perpendicular to the aperture rows. The rows are aligned with respect to each other in an interlacing manner so that the apertures form staggered lines as seen along the scanning direction. Thus, the staggered lines sweep continuous lines on the substrate surface without leaving gaps between them as they move relative to the substrate, thus covering the total area to be exposed on the substrate. In the U.S. Pat. No. 5,369,282, the apertures of every second row align and the pitch between neighboring apertures in a row is twice the width of an aperture; in general, an alignment of rows is possible based on any number n, the pitch then being n times the width of an aperture The article of I. L. Berry et al. in J. Vac. Sci. Technol. B 15 (1997) pp. 2382–2386, describes a PD device comprising a "programmable aperture array" with an array of 3000×3000 apertures of 5 µm side length with an n=4 alignment of rows and staggered lines. The aperture array contains additional logic circuitry, thus implementing an electronic mask scanning system in which the pattern information is passed by means of shift registers from one aperture to the next within a row. The article proposes to use a 200× demagnification ionoptical system for imaging the apertures of the BAA onto the substrate.

In the U.S.-2003-0155534-A1 (=GB 0300693.9=JP 2003-45145) of the applicant (assignee), a PD device is described which is composed of an aperture array means and a blanking means of the type as explained hereabove, realized as separate plates mounted together at defined distances, for instance in a casing. This blanking means has a plurality of openings, each opening corresponding to a respective aperture of the aperture array means and being provided with a deflection means controllable to deflect particles radiated through the opening off their path to an absorbing surface within said exposure apparatus.

With the above PD layouts, the general problem arises that the illuminating beam is actually not exactly telecentric (or homocentric, as the case may be), but has residual aberrations, due to unavoidable higher orders of the lenses and/or individual deficiencies of the lens elements. This may cause a situation where the passage of a beamlet is blocked since the local direction of the beamlet is not in line with the arrangement of consecutive openings in the plate components of the PD device. A similar effect will be due if a misalignment of the plate components is present. Groves et al., U.S. Pat. No. 5,981,962, disclose a multiple-beam direct write e-beam system with a set of separately and independently modified beams deflected by the same magnetic field and a uniform transverse electric field. For individual beam position and astigmatism correction, a total of 2 pairs of fine-deflection dipoles is arranged around each beam. Each dipole consists of 2 opposite plane electrodes, the dipoles of each pair are arranged at an angle of 90 degrees to each other. All dipoles of one pair are comprised on a plate with openings corresponding to the beam positions, the plate extending across the whole multiple beam system. The plates with the dipoles are formed by microlithographic techniques. According to FIGS. 3 and 4 of that document, each fine-deflection electrode is individually connected to a power supply by a conductor arranged on the same plate as the electrodes, and each fine-deflection electrode is applied its own individual potential. Such an arrangement is not possible in a PD device of the kind described above, due to the restricted space between the apertures and due to the high number of apertures—individual control of each fine-deflection unit would be unmanageable.

SUMMARY OF THE INVENTION

It is an aim of the present invention to improve PD devices of the kind described above, e.g. of the PD of the U.S.-2003-0155534-A1 or other particle optical systems with a PD comprised of aperture arrays, with regard to aligning the components to each other (as already-mentioned) but also with regard to the incoming illuminating beam as well as the projections system that processes the beam after its passage through the PD device.

The aim is met by a PD device wherein in the deflector array means, for each opening or group of openings at least two deflecting electrodes to which different electrostatic potentials are applicable are provided for correcting the path of the beamlet(s) and wherein, according to a partition of the plurality of apertures into a set of subfields, the deflecting electrodes belonging to the same subfield have common electric supplies.

This solution offers a simplified way to correct for the individual aberrations that may be present in a particle-optical exposure apparatus, in particular at the place of the PD device. The invention is based on the principal finding that the corrections to be introduced are not only small (as compared to the other deflections of the beam along its path) but also varying slowly across the cross-section of the beam. In fact, it was found that a treatment of the correction in groups will be sufficient to obtain a satisfactory compensation of the residual optical aberrations and/or misalignment of components.

In an advantageous development of the invention the electrostatic potentials of the deflecting electrodes belonging to the same subfield are interpolated between basic potentials fed at basic points of the respective subfield, in order to reduce the number of feeding lines that must be provided. This can be achieved by connecting corresponding deflecting electrodes belonging to the same subfield to two potentials, the connection being realized as an array of conductors with a predefined resistance between the electrodes, which realizes a linear interpolation in a cost-efficient manner. Furthermore, the electrostatic potentials of the deflecting electrodes belonging to the same subfield may be equal to basic potentials fed at basic points of the respective subfield.

In order to obtain a well-defined deflection quality of the beam with little cross-interference of neighboring beams, each opening of the deflector array means may be provided with at least one pair of deflecting electrodes.

In another variant of the invention with a reduced number of individual electrodes, electrode pairs are arranged along respective openings which each correspond to a plurality of beamlets and are aligned along straight lines.

Advantageously, the deflector array means comprises at least one plate, wherein corresponding deflecting electrodes are formed on the same plate. In an advanced aspect of the invention which allows for deflections along both lateral directions (i.e., X and Y, or radial and tangential), the deflector array means comprises two plates, each of which has the same plurality of openings, wherein in each plate the openings are provided with a pair of deflecting electrodes; and the orientation of the electrodes of the first of the plates is at an angle to the orientation of the electrodes of the second. In an advantageous variant of this aspect, the deflecting electrodes may be arranged in lines following the closest or second closest distance between the apertures. The mentioned angle between the orientations of the electrodes may be equal or different from 90°.

In order to obtain a better control for the correction of beam angle defects that (mainly) obey a radial dependence across the beam, the openings may be provided with pairs of electrodes arranged along circles around the optical axis.

Another possibility to realize an interpolation within a subfield, possibly non-linear, uses an array of conductors with a predefined resistance between the electrodes to connect corresponding deflecting electrodes belonging to the same subfield to two potentials.

A simplified layout of the deflector array means uses enlarged openings which allow the passage of more than one beamlet as produced by the apertures. In this case, the electrodes are arranged along openings which each correspond to a plurality of beamlets.

In a further aspect of the invention a deflector array means may be realized which is adapted to adjust the angles of the beamlets passing the apertures to correct for a deviation of the incoming beam from a desired homo- or telecentricity. A PD device of this kind may comprise several plates having corresponding plurality of openings, wherein the mentioned deflector array means is positioned immediately after the first plate of the device.

In another aspect of the invention a deflector array means may be realized which is adapted to adjust the angles of the beamlets passing the apertures to minimize the aberration of a crossover formed in a projection optics after said device in the particle-beam exposure apparatus. In a PD device of this kind, this deflector array means may be positioned immediately before the aperture array means.

In yet another aspect of the invention a deflector array means may be realized which is adapted to produce a virtual object different from the object as defined by the apertures of the aperture array means.

Of course, these aspects may be combined with each other. In particular, an advantageous combination may result in a PD device comprising two deflector array means. In this variant the first deflector array means is adapted to adjust the angles of the beamlets passing the apertures to minimize the aberration of a crossover formed in a projection optics after said device in the particle-beam exposure apparatus, and the second deflector array means is adapted to produce a virtual object different from the object as defined by the apertures of the aperture array means; additionally, the two deflector array means are able to adjust the position of the virtual object and the angles of the beamlets independently from each other.

BRIEF DESCRIPTION OF THE DRAWINGS

In the following, the present invention is described in more detail with reference to a preferred embodiment illustrated in the drawings, which schematically show:

FIG. 2 a plan view of the aperture arrangement in a pattern definition device of the lithography apparatus of FIG. 1;

FIG. 3 an image field as present on a substrate surface in the lithography apparatus of FIG. 1;

Figure 1:
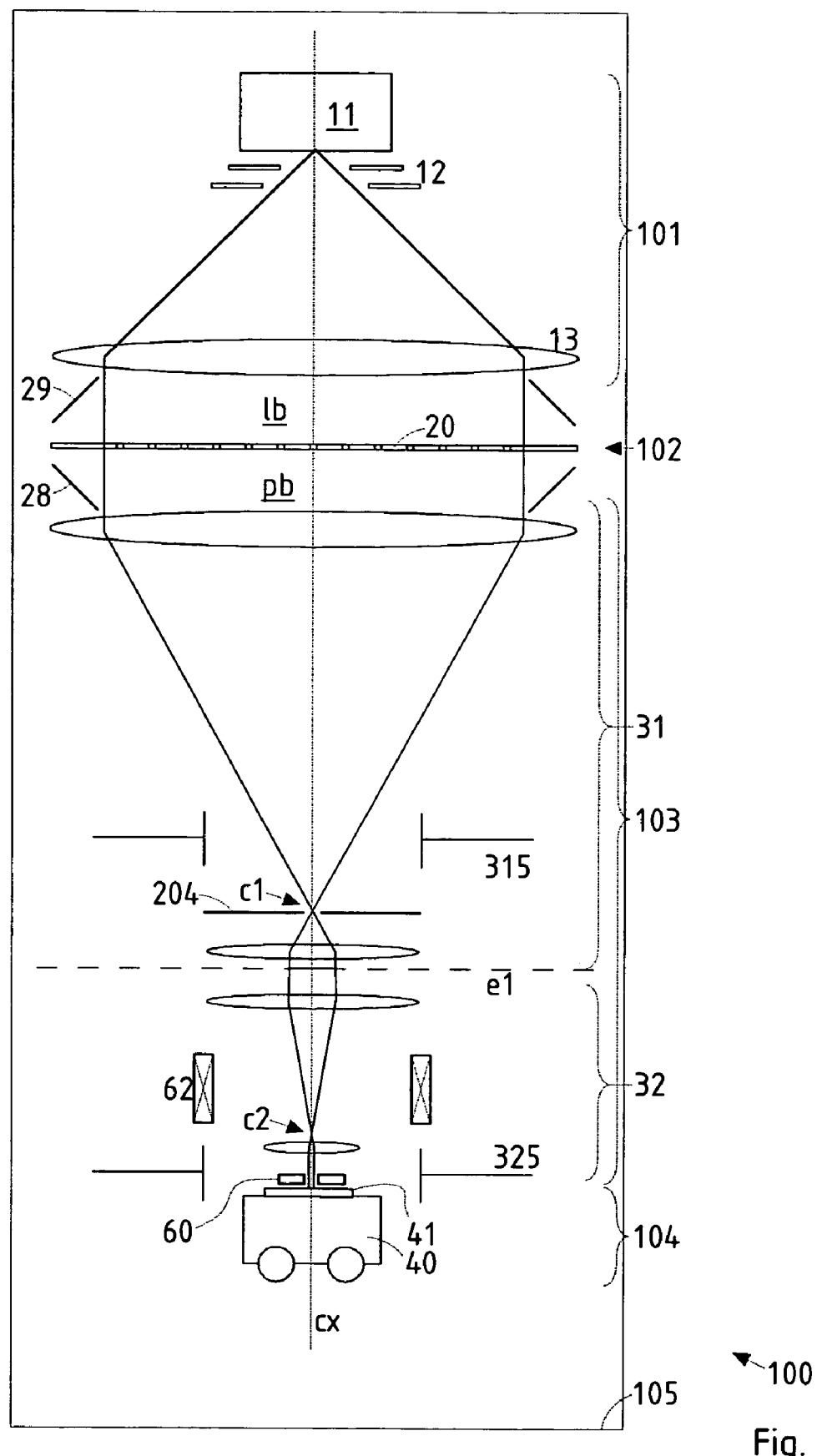
FIG. 1 in a longitudinal section a layout of a lithography apparatus to which the invention applies.
Figure 4:
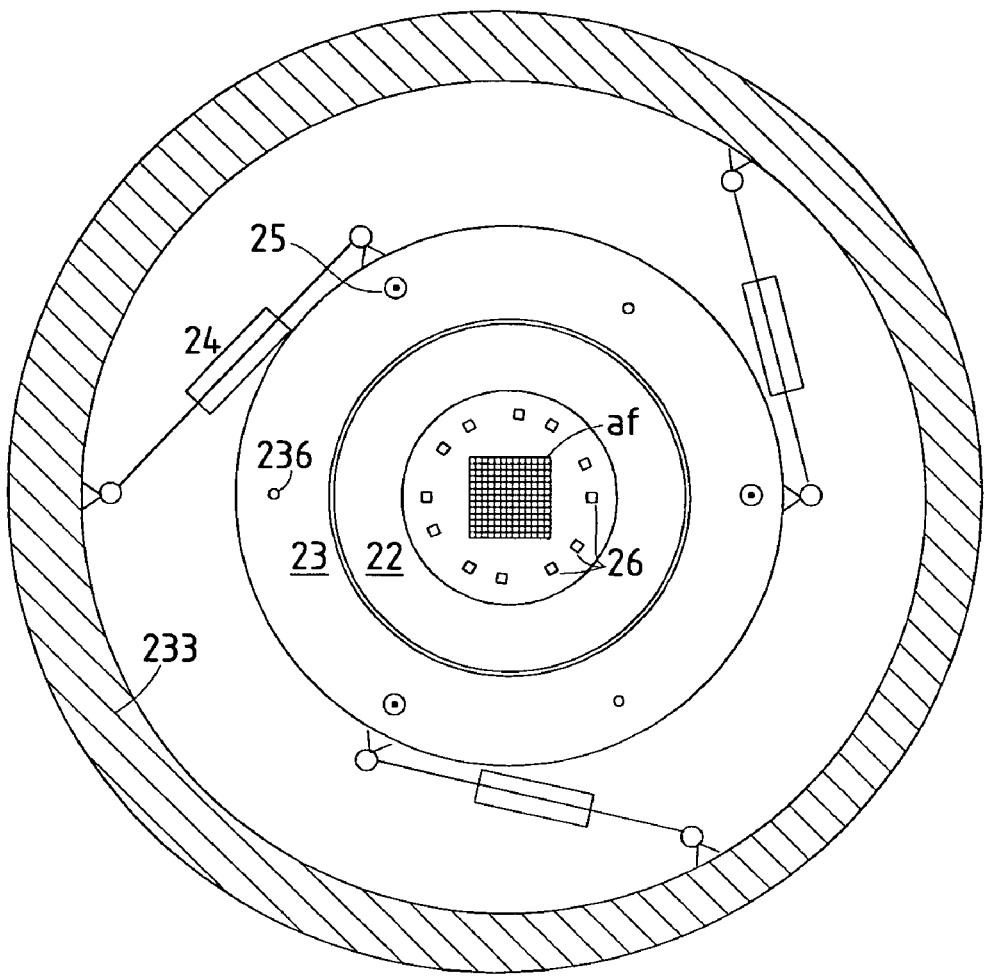
Figure 5:
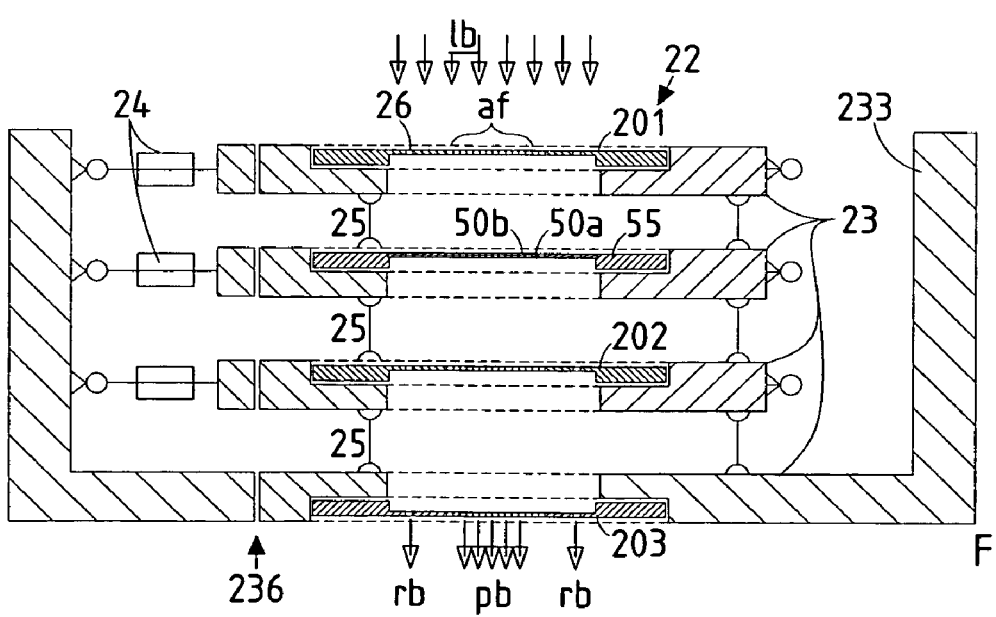
Figure 6:
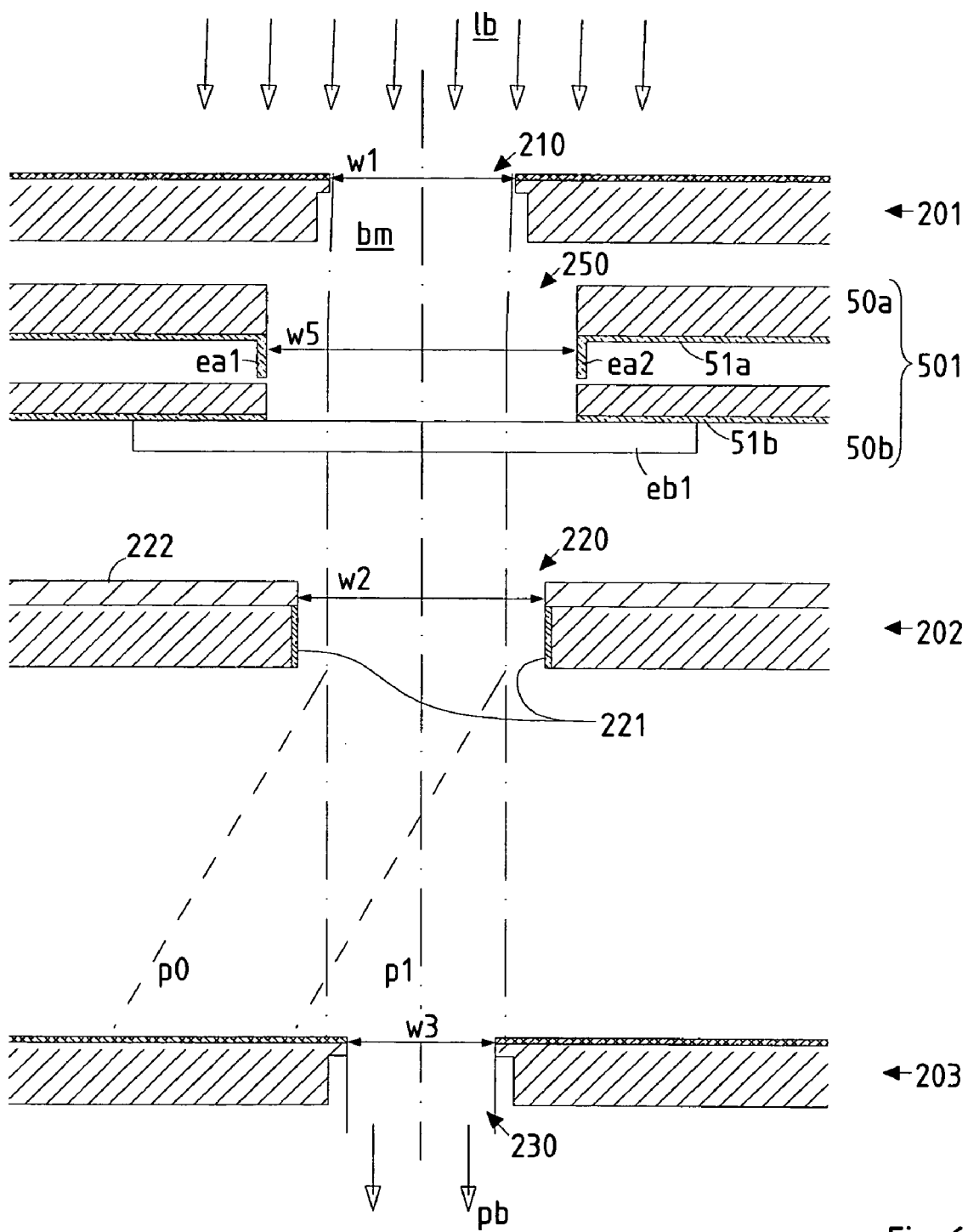
Figure 7A:
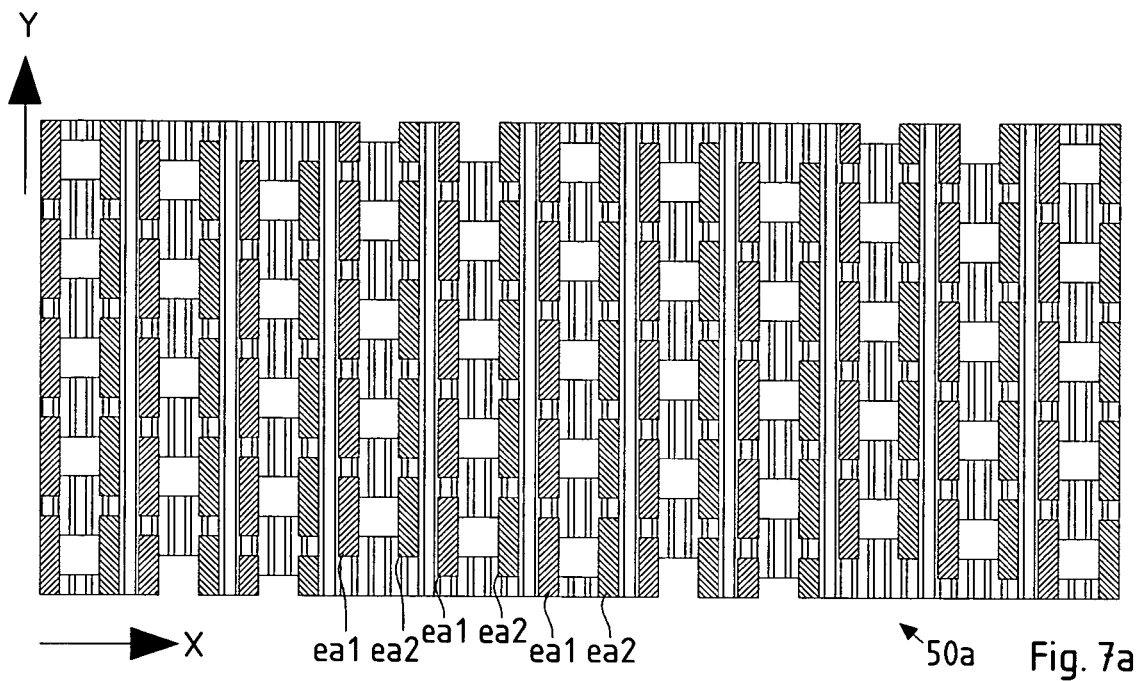
Figure 7B:
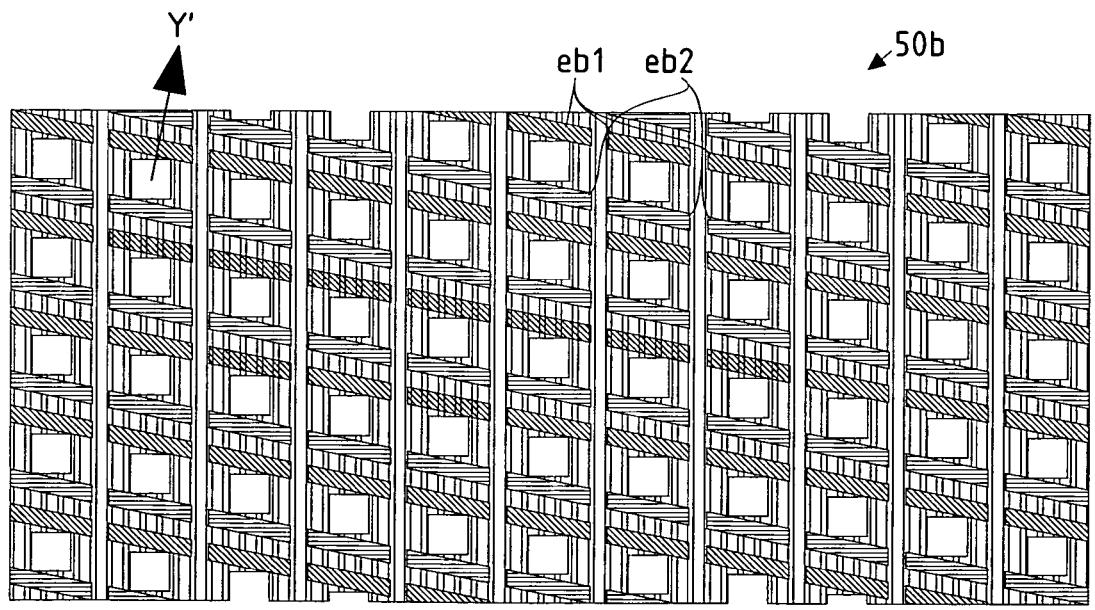
Figure 8A:
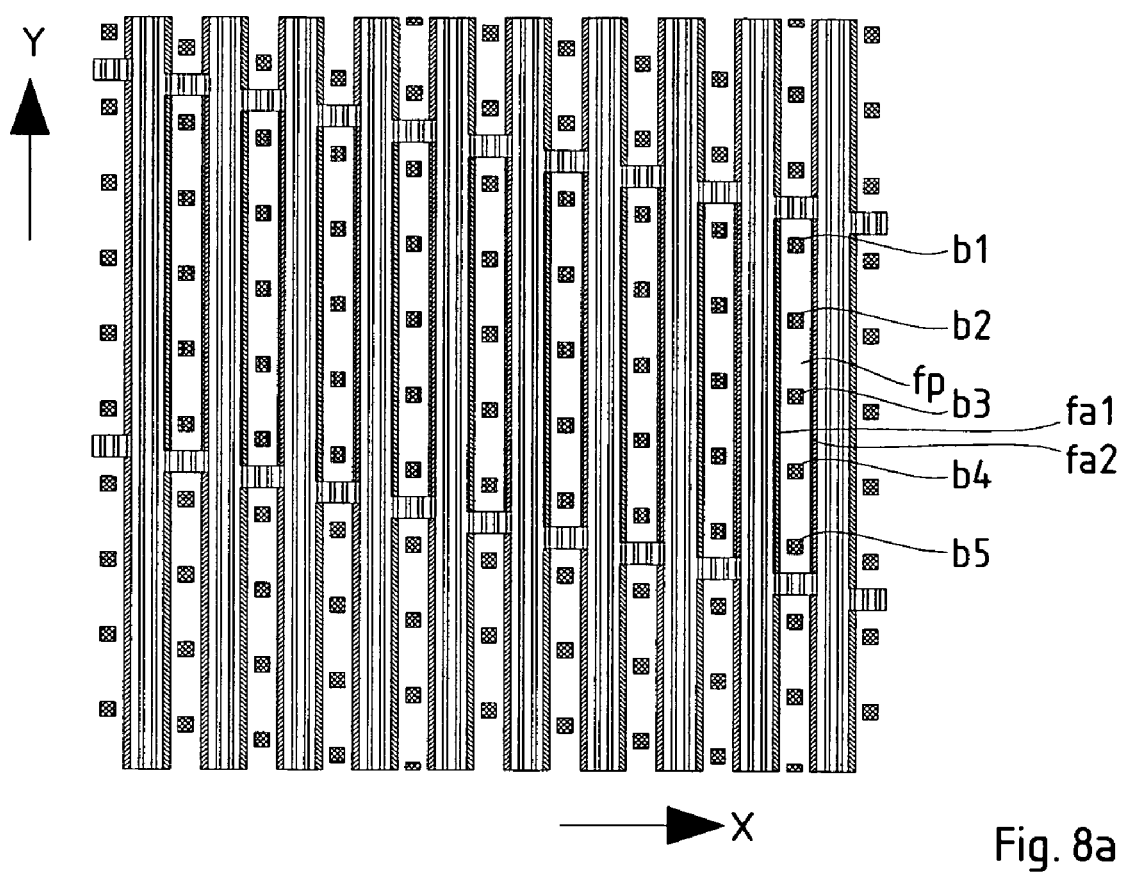
Figure 8B:
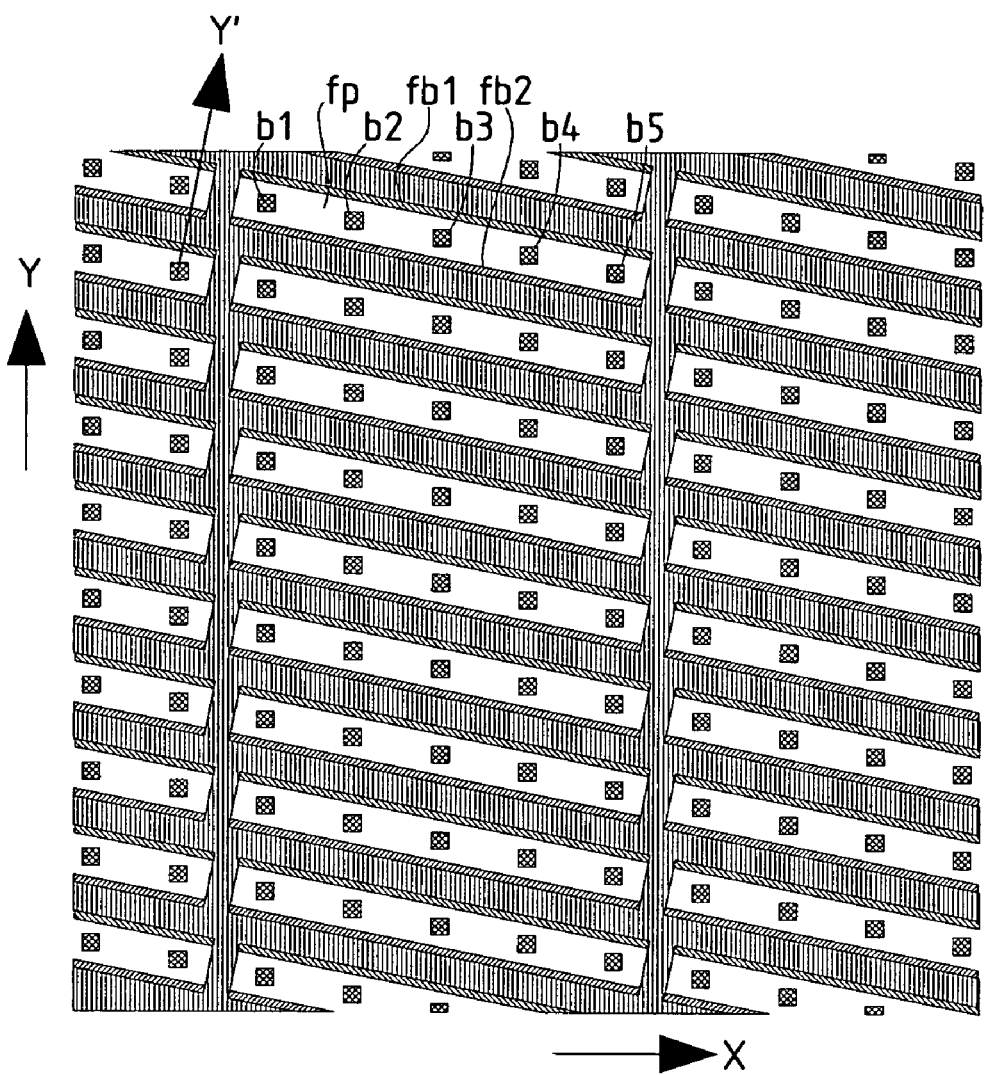
Figure 8C:
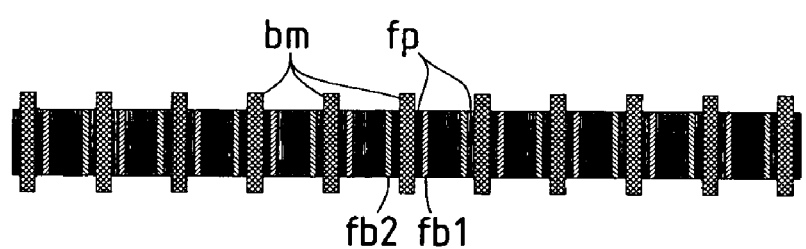
Figure 9:
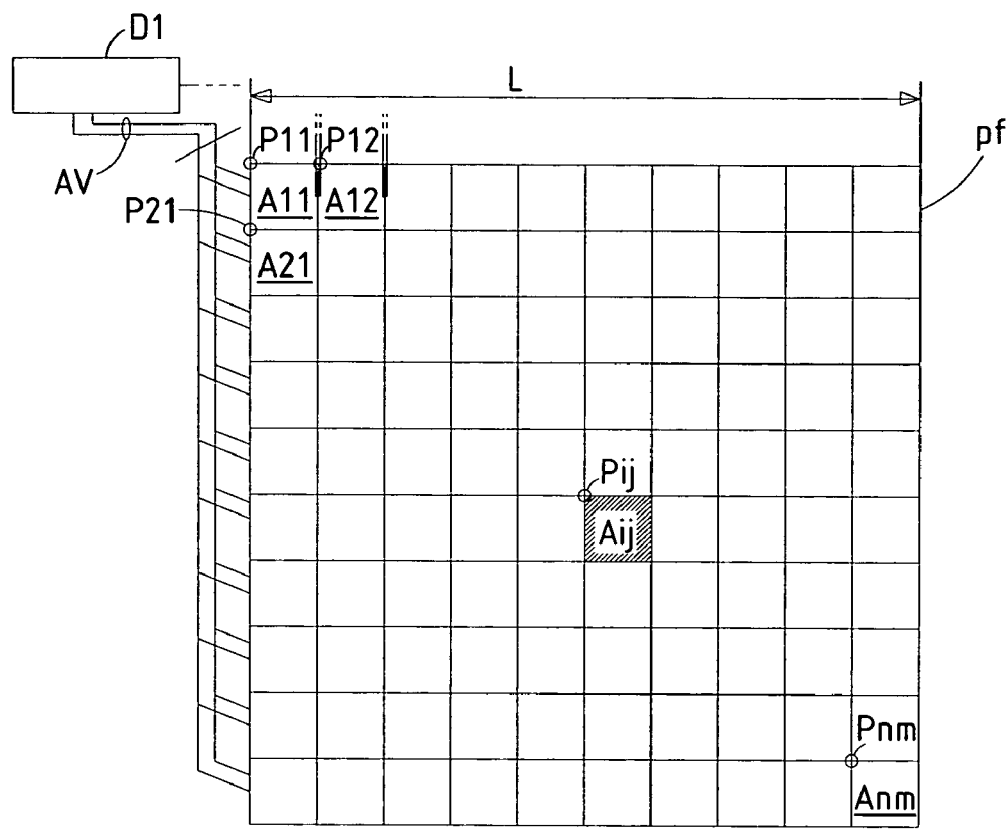
Figure 10:
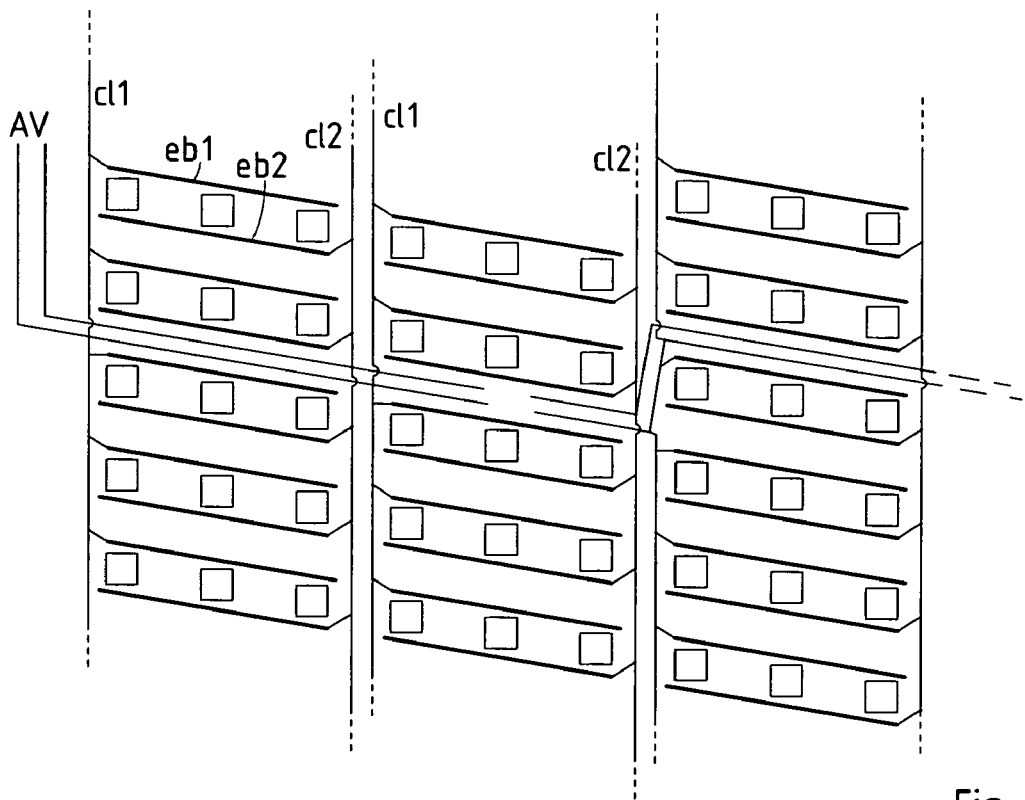
Figure 11A:
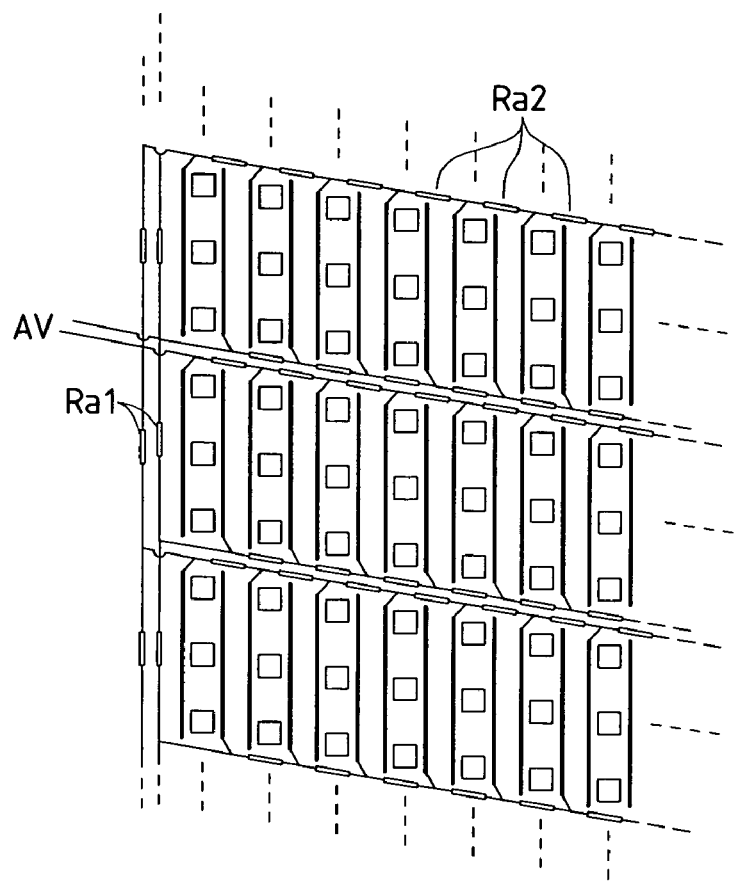
Figure 11B:
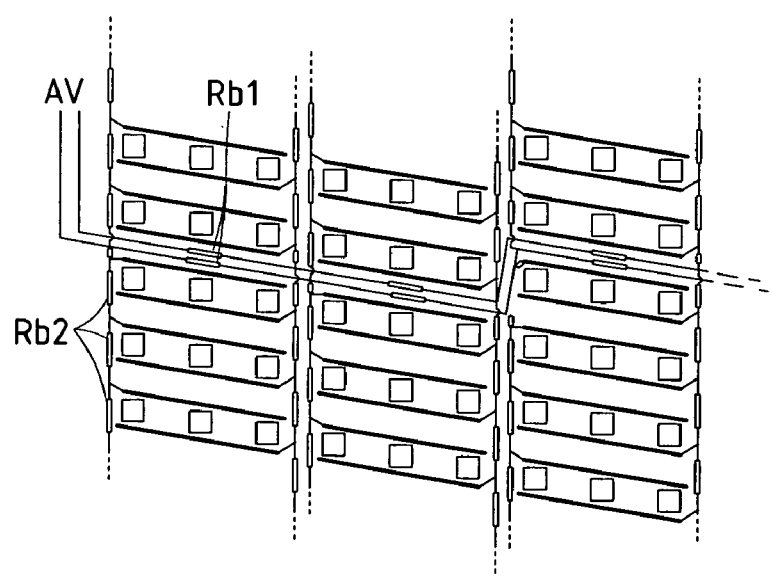
Figure 12:
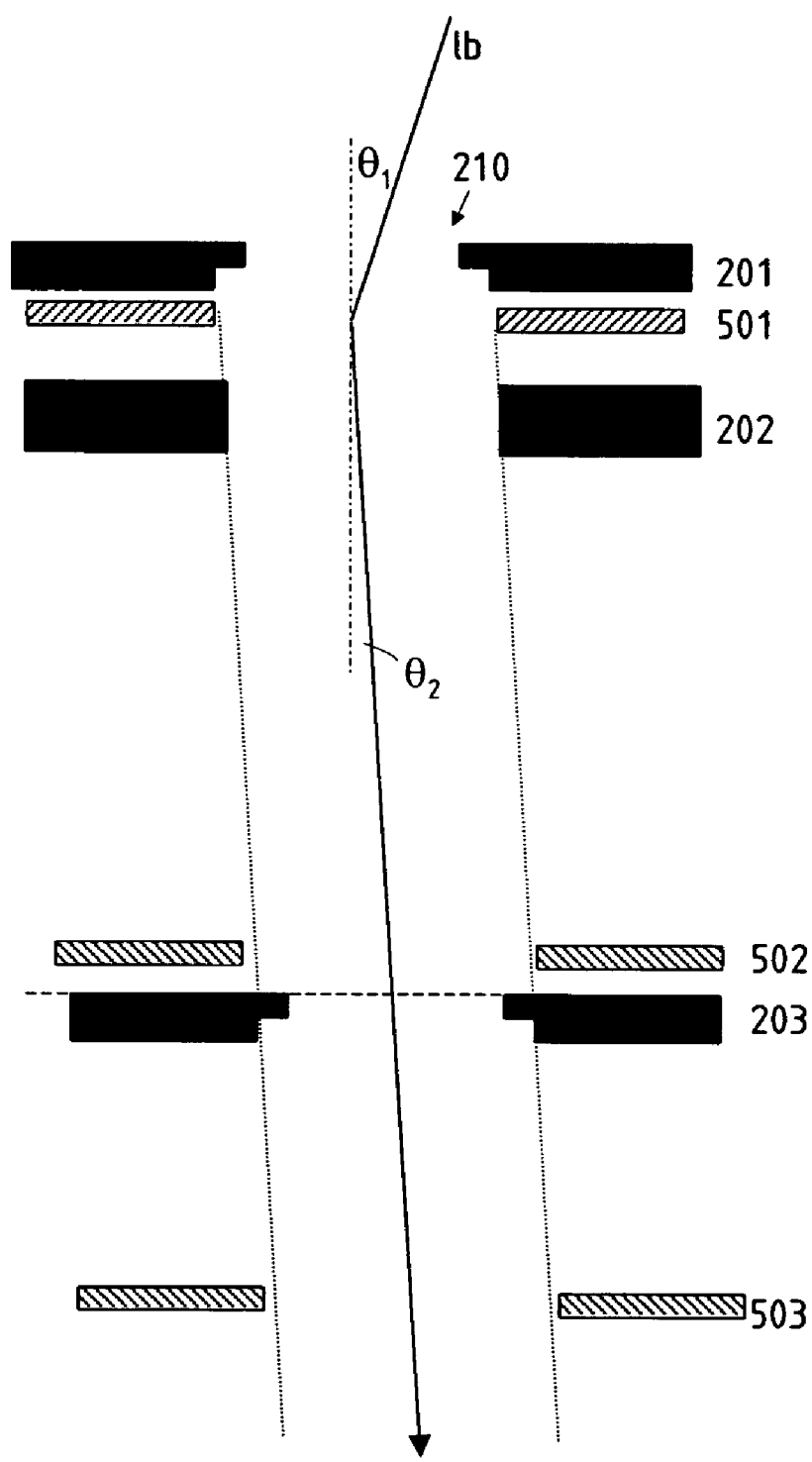
Figure 13:
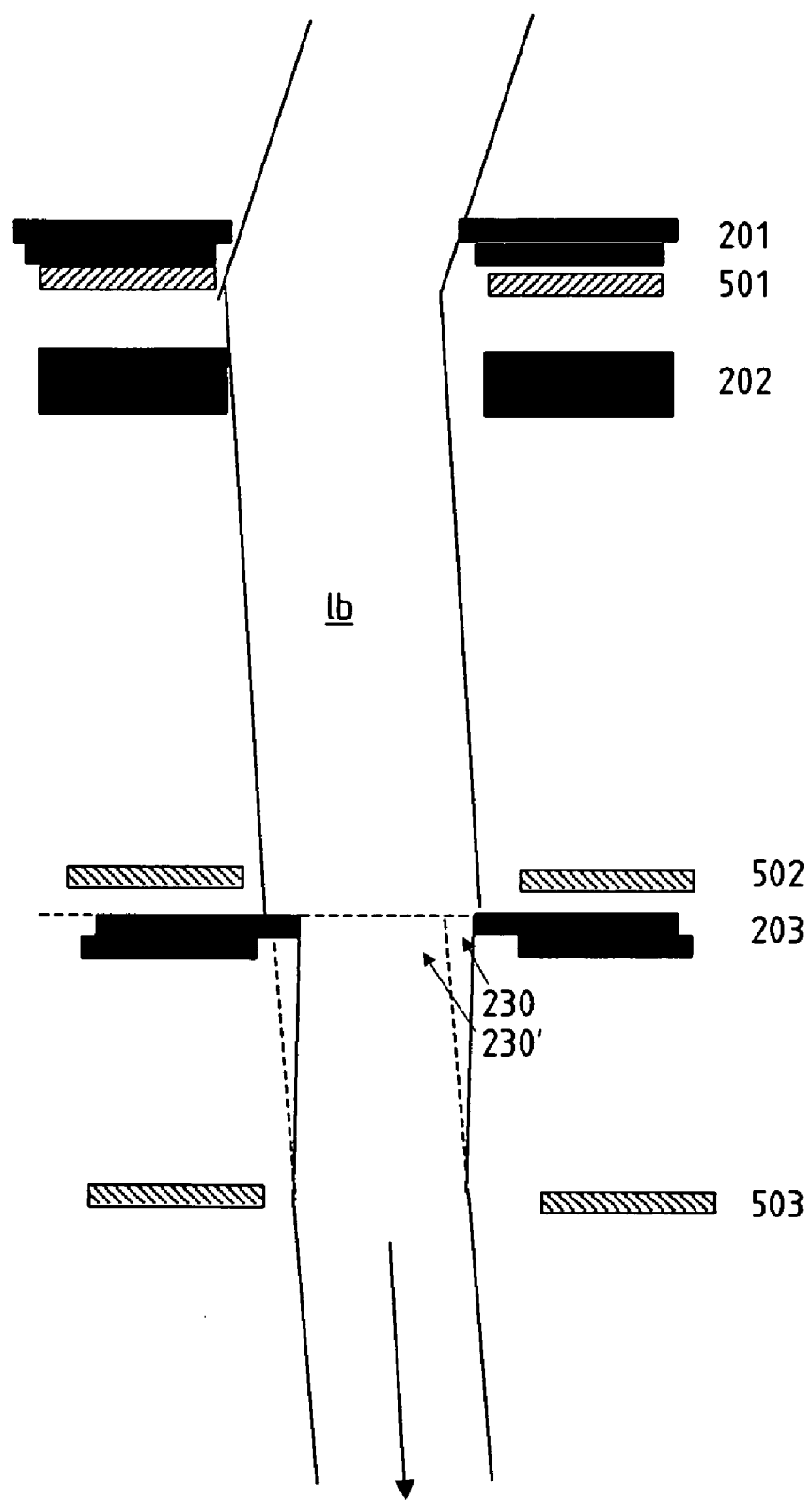
Figure 14:
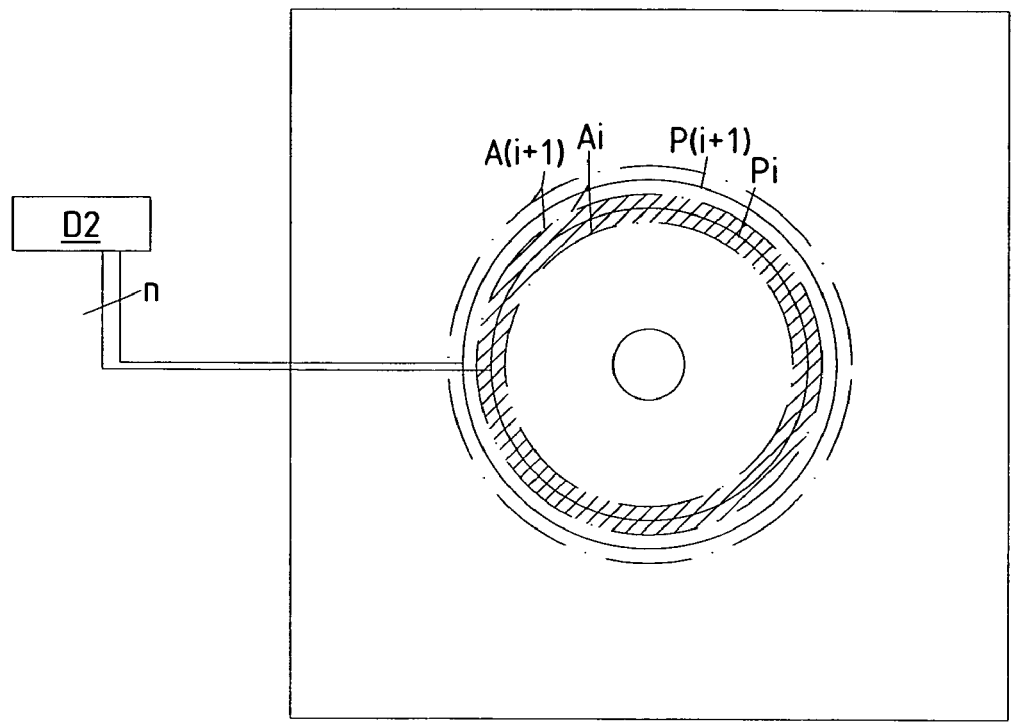

31 an enlarged view of a portion of the image field shown in FIG. 3;

FIG. 4 the pattern definition device of the lithography apparatus of FIG. 1 in a top view, including a first adjustment unit according to the invention, positioned in front of the blanking means at a distance before the aperture array;

FIG. 5 the pattern definition device of the lithography apparatus of FIG. 1 in a longitudinal section, including a first adjustment unit according to the invention, positioned in front of the blanking means at a distance before the aperture array;

FIG. 6 a detail of FIG. 5 along one aperture;

FIG. 7a detail plan view of the arrangement of electrodes in a deflector array means according to the invention, organized in two deflector plates with the electrodes running in a direction following the closest distance (X-direction);

FIG. 7b detail plan view of the arrangement of electrodes in a deflector array means according to the invention, organized in two deflector plates with the electrodes running in a direction following the second closest distance (non-X direction);

FIG. 8a a variant of the arrangement of electrodes, with one electrode pair serving more than one aperture of the aperture array;

FIG. 8b a variant of the arrangement of electrodes, with one electrode pair serving more than one aperture array;

FIG. 8c a variant of the arrangement of electrodes, with one electrode pair serving more than one aperture array;

FIG. 9 a partitioning of the aperture field area into sub-areas for the electrostatic supply of the electrodes;

FIG. 10 a conductor line layout of the electrostatic supply of the electrodes of FIG. 7b;

FIG. 11a the electrostatic supply with a resistor array for X-type electrodes;

FIG. 11b the electrostatic supply with a resistor array for non-X-type electrodes;

FIG. 12 the function of the first deflection array means (adjustment unit) located in front of the blanking means of the lithography apparatus of FIG. 1;

FIG. 13 the function of a second adjustment unit and a third adjustment unit according to the invention, positioned before and after the aperture means, respectively;

FIG. 14 a "radial" variant of the electrode layout, with the corresponding partitioning of the electrodes into sub-areas.

Figure 15:
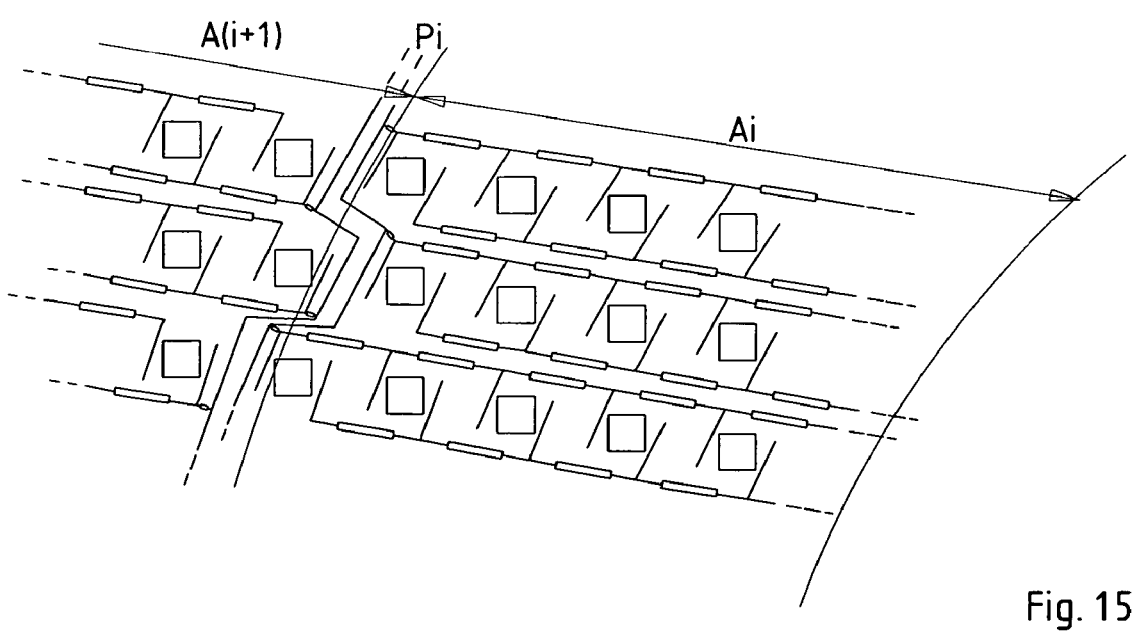

FIG. 15 a detail of a layout of the conductor lines with a resist array for a linear interpolation for a ring Ai and a portion of ring A(i+1).

DETAILED DESCRIPTION OF THE INVENTION

The preferred embodiment discussed in the following is based on the pattern definition (PD) system disclosed in the U.S.-2003-0155534-A1. In the following, the technical background of the PD system, as far as relevant to the invention, is first discussed with reference to FIGS. 1 to 5 (which were taken, with modifications where appropriate, from the U.S.-2003-0155534-A1), then an embodiment of the invention in the PD system is illustrated in FIGS. 6 to 15. It should be appreciated that the invention is not restricted to the embodiment discussed in the following, which merely represents one of the possible implementations of the invention.

An overview of a lithographic apparatus employing the preferred embodiment of the invention is shown in FIG. 1. In the following, only those details are given as needed to disclose the invention; for the sake of clarity, the components are not shown to size in FIG. 1. The main components of the lithography apparatus 100 are—corresponding to the direction of the lithography beam lb, pb which in this example runs vertically downward in FIG. 1—an illumination system 101, a PD system 102, a projecting system 103, and a target station 104 with the substrate 41. The whole apparatus 100 is contained in a vacuum housing 105 held at high vacuum to ensure an unimpeded propagation of the beam lb, pb along the optical axis cx of the apparatus. The particle-optical systems 101, 103 are realized using electrostatic or electromagnetic lenses.

The illumination system comprises, for instance, an electron gun 11, an extraction system 12 as well as a condenser lens system 13. It should, however, be noted that in place of electrons, in general, other electrically charged particles can be used as well. Apart from electrons these can be, for instance, hydrogen ions or heavier ions.

The extraction system 12 accelerates the particles to a defined energy of typically several keV, e.g. 10 keV. By means of a condenser lens system 13, the particles emitted from the source 11 are formed into a wide, substantially telecentric particle beam serving as lithography beam lb. The lithography beam lb then irradiates a PD device 20 which, together with the devices needed to keep its position (see below, FIGS. 9 and 10 below), form the PD system 102. The PD device 20 is held at a specific position in the path of the lithography beam lb, which thus irradiates a plurality of apertures 21 (see FIG. 2). Some of the apertures are "switched on" or "open" so as to be transparent to the incident beam; the other apertures are "switched off" or "closed", i.e. non-transparent (opaque) to the beam. The pattern of switched-on apertures is chosen according to the pattern to be exposed on the substrate, as these apertures are the only portions of the PD device transparent to the beam lb, which is thus formed into a patterned beam pb emerging from the apertures (in FIG. 1, below the device 20).

The pattern as represented by the patterned beam pb is then projected by means of an electro-magneto-optical projection system 103 onto the substrate 41 where it forms an image of the switched-on mask apertures 21. The projection system 103 implements a demagnification of, for instance, 200× with two crossovers c1, c2. The substrate 41 is, for instance, a silicon wafer covered with a photo-resist layer. The wafer 41 is held and positioned by a wafer stage 40 of the target station 104.

The apparatus 100 may further comprise an alignment system 60, which allows to stabilize the position of the image of the mask apertures (image field mf, FIG. 3) on the substrate with respect to the particle-optical system by means of reference beams which are formed in the PD system by reference marks 26 at the side of the PD field pf (FIG. 2); the principles of an alignment system are described in the U.S. Pat. No. 4,967,088. For instance, correction of image position and distortion can be done by means of a multipole electrode 315, 325; additionally, a magnetic coil 62 can be used to generate a rotation of the pattern in the substrate plane.

In the embodiment of the invention shown in FIG. 1, the projection system 103 is composed of two consecutive electro-magneto-optical projector stages 31, 32. The lenses used to realize the projectors 31, 32 are shown in FIG. 1 in symbolic form only, as technical realizations of particle imaging systems are well known in the prior art, such as, for instance, the U.S. Pat. No. 4,985,634 (=EP 0 344 646) of the applicant (assignee). The first projector stage 31 images the plane of the apertures of the device 20 into an intermediate plane e1 which in turn is imaged onto the substrate surface by means of the second projector stage 32. Both stages 31, 32 employ a demagnifying imaging through crossovers c1, c2. The demagnification factor for both stages is chosen such that an overall demagnification of several hundred results, e.g. 200×. A demagnification of this order is in particular suitable with a lithography setup, in order to alleviate problems of miniaturization in the PD device.

In both projector stages the respective lens system is well compensated with respect to chromatic and geometric aberrations; furthermore, a residual chromatic aberration of the first stage 31 can be compensated by suitable fine correction of the electrode potentials in the second stage 32.

As a means to shift the image laterally as a whole, i.e. along a direction perpendicular to the optical axis cx, deflection means 315, 325 are provided in one or both of the projector stages. The deflection means can be realized as, for instance, a multipole electrode system which is either positioned near to the crossover, as shown in FIG. 1 with the first stage deflection means 315, or after the final lens of the respective projector, as is the case with the second stage deflection means 325 in FIG. 1. In this apparatus, a multipole electrode is used as deflection means both for shifting the image in relation to the stage motion and for correction of the imaging system in conjunction with the alignment system. These deflection means 315, 325 are not to be confused with the deflection array means according to the invention, since the former only deal with the particle beam as a whole.

FIG. 2 shows a plan view of the arrangement of apertures in the PD device 20. A plurality of square-shaped apertures 21 is provided which are arranged within a PD field pf in a regular array in which the apertures 21 are aligned along adjacent lines p1, wherein in each of the lines p1 the same number of apertures is present. Seen along the direction perpendicular to the lines p1, the apertures form a sequence of rows r1, r2, r3; in the embodiment shown, the rows r1–r3 are not adjacent but spaced apart. The apertures are arranged in aperture fields af according to a skewed regular arrangement such that the apertures of every third row align (n=3) as the pitch pn between neighboring rows is three times the width w of an aperture (i.e., pn=n×w), and the offset pm between neighboring rows is 4 times the width of an aperture (i.e., pm=m×w with m=4). Within a line p1, the offset of apertures is n·pm=12. Thus, the apertures cover only 1/(n×m)=1/12 of the area of the field pf and, at a time, only one out of n×m=12 image elements can be exposed as shown in FIG. 3; the other elements are exposed in subsequent steps by means of moving the substrate along the "scanning direction" sd relative to the image of the apertures. FIG. 3 illustrates the image field mf produced on the substrate; for the sake of clarity it is assumed that all apertures are switched on in this figure. The width fw of the image field is the width L of the PD field pf reduced by the demagnification factor of the projection system. The image field is composed of a plurality of image elements mx (also referred to as pixels). For a given position of the image field on the substrate, each of the apertures 21 of the aperture array corresponds to an image element mx, but as the apertures only cover a fraction of the PD field area, only a corresponding fraction of the number of image elements (shown hatched in FIG. 3) can be exposed at a time. In order to expose also the other image elements, the substrate is moved under the beam so as to shift the image field on the substrate. FIG. 3a illustrates the exposure of pixels in subsequent positions of the motion of the substrate through the possible 12 (=n×m) positions; the pixels are accordingly referenced with letters a to l (the pixels shown hatched are position a). The whole image field mf is moved over the surface of the photoresist-covered wafer serving as substrate 41 so as to cover the total area of the substrate surface. In the example discussed here, the minimum feature size shall be 50 nm, and the smallest spot to be illuminated on the wafer, here defined as the pixel width x, is 25 nm. The image field width fw is 300 µm; in order to produce this image field in connection with a 200× demagnification projection system (see above), the square-shaped PD field has a width L=60 mm. Consequently the number of lines p1 is L/w=12000, and 12000 bit streams are to be addressed by the incoming data stream. In the direction across, there are fw/(n·x)=L/(n·w)=4000 apertures in each of the rows r1–r3.

FIGS. 4 and 5 show the PD system 102 of the apparatus 100, namely, in FIG. 4 a top view and in FIG. 5 a longitudinal-sectional view. FIG. 6 shows a detail of FIG. 5, illustrating the configuration of the set of plates constituting the PD system 102 of the present embodiment along one aperture. The PD system 102 comprises a number of plates 22 mounted in a stacked configuration, realizing a composite device whose components serve respective functions, including an adjustment unit 501 according to the invention. Each of the plates 22 is realized as a semiconductor (in particular silicon) wafer in which the structures were formed by microstructuring techniques known in the art. The lithography beam traverses the plates through an array of apertures in the PD field pf (FIG. 5). Each aperture corresponds to a set of openings 210, 220, 230, 250 which are defined in the plates 22 (FIG. 6).

The thickness of each of the plates 22 is about 100 µm; their mutual distance is in the order of 100 µm to 1 mm. It should be noted that in FIGS. 5 and 6, the dimensions in the longitudinal axis (z-axis parallel to the optical axis of the apparatus) are enlarged and not to scale.

The blanking of the beamlets is controlled by means of a blanking means realized as a blanking plate 202 which comprises an array of openings 220, each corresponding to an aperture, in a blanking field bf. Each opening 220 comprises a set of beam blanking electrodes 221 as well as the circuitry 222 for controlling the electrodes 221, which are accommodated, for instance, in the upper surface layer of the blanking plate 202. The blanking elecrodes 221, serving as aperture deflection plates as described below, are formed in the blanking openings by perpendicular growth employing state-of-the-art techniques. More details about the layout of the blanking plate 202 and its circuitry 222 can be found in the U.S.-2003-0155534-A1.

In front of the blanking plate 202, as seen in the direction of the lithography beam, a cover means realized as a cover plate 201 is provided in order to protect the blanking plate 202, in particular the circuitry 222, from irradiation damage. The cover plate 201 takes up the majority of the impingent lithography beam lb; the particles can only pass through the openings 210, formed in an array corresponding to that of the blanking plate, which openings make up only a small fraction of the total area of the blanking field bf. For instance, with an irradiation density of 4 µA/cm$^2$ of electrons of 10 keV, the heat load to the cover plate is approximately 40 mW/cm$^2$. This heat input is compensated by thermal radiation from its surface (in conjunction with cooling elements 29 located in front of the PD system, cf. FIG. 1) and by heat flow through the bulk material of the cover plate. More details about the layout of the cover plate 201 can be found in the U.S.-2003-0155534-A1.

The width w2 of the opening 220 in the blanking plate 202 is greater than the width w1 of the opening 210 in the cover plate 201, so the beamlet bm defined by the latter opening will pass through the former opening without affecting the controlling circuitry 222 on the blanking plate 202. For instance, the width w2 can be 7 µm (as compared to the defining width of the aperture of w=5 µm).

The PD system 102 further comprises an aperture array means which serves to define the beamlet laterally and which is here realized as an aperture plate 203 with an array of openings having a width w3, positioned after the cover and blanking plates 201, 202. More details about the layout of the aperture plate 203 can be found in the U.S.-2003-0155534-A1.

It is the aperture 230 of width w3 (rather than the initial opening in the cover plate 201) which defines the lateral shape of the beamlet emerging from the system 102 (corresponding to the width w of an aperture in FIG. 2). Therefore, in the discussion referring to FIG. 5ff, the term 'apertures' is reserved to the openings of defined shape and width w (FIG. 2) as defined by the beamlet-defining apertures 230, in contrast to 'opening' which is used as generic term.

The beamlet bm transgresses the subsequent openings of the plates 22 along the path p1 provided the blanking electrodes 221 are not energized; this corresponds to the "switched-on" state of the aperture. A "switched-off" aperture is realized by energizing the electrodes, applying a transverse voltage. In this state, the blanking electrodes 221 deflect the beamlet bm off the path p1 so the beamlet cannot pass through the final aperture in the plate 203 but is absorbed instead at a position p0 off the aperture 230.

As becomes clear from the above discussion, the cover plate 201 and the aperture plate 203 (which will have to absorb those beamlets deflected to an off-aperture position p0)—and, if present, the upper plate of the adjustment unit 502—are the only components which come into contact with the radiation of the lithography beam. Therefore, only these plates will have to be replaced at periodic intervals whereas for the other plates a provision of replacement at regular time intervals is not necessary.

According to the invention, one or more additional adjustment units 501, 502, 503 are provided in the PD device (FIGS. 12 and 13). In FIG. 6, a simplified variant is shown having only one adjustment unit 501, positioned between the cover and blanking plates 201, 202. The adjustment units serve to control the path of the beamlets bm as they travel along the set of openings 210, 220, 230, 250 of the PD system 102, thus taking into account the effects of, and correcting for, possibly non-perfect matching of the components of the apparatus 100 with the PD device and/or the alignment of components (plates) of the PD device to each other, as well as dimensional deviations of the PD device components, in particular those that will occur due to fabrication and mounting tolerances. Also, some optical aberrations like the image distortion and field curvature can be reduced as well as the image distortion caused by the global space charge effect. In the embodiment shown, up to three adjustment units are present; in other embodiments of the invention, any suitable combination of adjustment units could be implemented.

Preferably, an adjustment unit 501 is positioned immediately after the first plate of the PD system, i.e., the cover plate 201, as shown in FIG. 6. The adjustment unit 501 helps to reduce the requirements imposed on the illumination system 101 and makes the alignment of the PD plates easier, as discussed below referring to FIG. 13.

The adjustment unit 501 can be realized as explained in the following with reference to FIGS. 6 to 11. An adjustment unit is composed of two deflector plates 50a, 50b, which each have conductor planes 51a, 51b comprising the electrodes and feeding lines at the "bottom" side (the side facing towards the target). The deflector plates 50a, 50b are aligned and fixed to each other by bonding or vacuum-compatible gluing. The electric contacts between the different conductor planes 51a, 51b are made by, for instance, wire bonding. The deflector plates are provided with an array of openings matching the apertures of the PD system, but having a width w5 which is well greater than the width w1 of the beamlet as defined by the cover plate.

A plan view of the deflector plates 50a, 50b is shown in FIGS. 7a and 7b respectively. In each deflector plate 50a, 50b, a multitude of electrode pairs ea1, ea2, eb1, eb2 is realized in a manner that each of the openings 250 lies between the opposing electrodes of an electrode pair. Inducing a dipole electrical field between an electrode pair results in a change of the angle of the beamlet passing the opening in between with respect to the optical axis (z-axis). Such a dipole field is formed by applying different electrostatic potentials to each electrode of a pair. Each of the electrode pairs ea1, ea2 of the deflector plate 50a (FIG. 7a) effects an angular change to the respective beamlet in, say, the X-direction, whereas the electrodes eb1, eb2 of the other deflector plate 50b serve to induce an angular change in another direction Y' in the X-Y-plane, sufficiently different from X-direction. The Y' may be perpendicular to the X direction or at an angle different from 90° as shown in FIGS. 7a and 7b.

During one wafer exposure, the electric potentials applied to the electrodes of the adjustment unit 501 are practically constant over time or varying only slowly in order to adapt to varying substrate geometry during the process of the scanning of the substrate field (FIG. 4). Also, the spatial variation of the electric potentials within the adjustment unit (i.e., with regard to different x-y positions of the same adjustment unit) is slow as the required angular changes will vary only gradually. This is in marked contrast to the blanking plate 202 which operates the blanking of openings 210 individually for each opening and at short time intervals, as already mentioned above. Therefore, as can be seen from FIGS. 7a, 7b, the electrode pairs are arranged in lines that follow the closest (FIG. 7a) and second closest (FIG. 7b) distance between neighboring openings. Due to the slow variation in angular deflection, this arrangement allows to apply the same potential to a group of n adjacent electrodes ea1 and ea2, respectively. How the potentials are applied will be explained in more detail with reference to FIGS. 9 to 12. The number of electrodes that are grouped together must be small enough so that the resulting steps in the deflection (from one group to the next) are sufficiently low. The electrodes belonging to a group may also be formed as one set of common electrodes. This is shown in FIGS. 8a and 8b which show a variant in which not only an electrode pair serves several beamlets, but also only a single opening is provided between the electrodes for all the beamlets associated. FIGS. 8a and 8b relate to the arrangement for the X- and non-X-directions, respectively, where each electrode pair fa1, fa2, fb1, fb2 is used for five apertures. The electrodes are arranged at the long side of rectangular openings fp, through each of which five beamlets b1–b5 corresponding to the five apertures are deflected. Again, the number n of apertures that are grouped together must be small enough so that the resulting steps in the deflection (from one group to the next) are sufficiently low.

FIG. 8c shows a section through the plate of FIG. 8b along a Y direction, with the beamlets bm passing through the openings fp.

The fact that the deflector electrodes are arranged in corresponding lines, such as regular rows running in parallel (FIGS. 7 and 8) or concentric lines (FIG. 15), and that the field between them varies very slowly, strongly reduces the marginal effects perpendicular to the deflecting direction, or even avoids these effects completely in the case of the inner three (n 2) openings/beamlets between two electrodes of a pair shown in FIG. 8.

For the feeding of the potentials to the electrodes and, more specifically, for provision of a gradual variation of the potentials of the electrodes between the feeding points, various ways are possible.

One way is to partition the entire aperture area in n×m sub-areas A11, A12, . . . Anm as shown in FIG. 9. Then the electrodes of the pairs in each of the sub-areas Aij (i=1, . . . , n; j=1, . . . , m) are assigned the same potential differences. This is a sufficient approximation to a nominal function calculated from theoretical or experimental data if the variation of the electric potentials according to the nominal function is sufficiently low. Then, for each of the sub-areas Aij, the feeding potentials determined for a representative point in the sub-area is used. The representative point is taken as one of the edges, for instance the upper left edge, or the central point of the respective sub-area.

In FIG. 9 the aperture area is divided into rectangular, almost square-shaped, sub-areas of equal size. The feeding connections for each of the sub-areas Aij are supplied from outside the deflector field to a feeding point Pij. The values of the potentials are fed as, for instance, digital signals through electric lines to digital-analog converters (DACs) D1 which convert the digital signals into analog voltage signals AV used as the feeding potentials for the electrodes. The distribution of the potentials to the respective electrodes is done using separate conductor lines cl1, cl2 for both polarities as shown in FIG. 10 for the non-X-type electrodes eb1, eb2 for groups of 3 openings. The conductor lines cl1, cl2 are located in different layers, separated from each other by insulator layers, on a wafer bulk substrate. The electrodes are connected with the respective conductor lines by means of contact points. For the production of the conductor lines and contact points state-of-the-art lithography and etch techniques can be used.

Another possibility is to use a resistor array in order to obtain a linear interpolation of the potentials between adjacent feeding points Pij. For each of the sub-areas Aij (i=1, ..., n; j=1, ..., m) the four lattice points Pij, P(i+1)j, Pi(j+1), P(i+1)(j+1) are connected in the array. As shown in FIG. 11a for the example of X-type electrodes ea1, ea2, the linear function of the potential in the sub-area between the four lattice points is realized by means of a suitable arrangement of resistors Ra1, Ra2 between the contact points. FIG. 11b shows the analogous array of resistors Rb1, Rb2 for corresponding non-X-type electrodes eb1, eb2. For either polarity a resistor array is provided. The resistors Ra1, Ra2, Rb1, Rb2 are realized as a layer of resistive material of appropriate thickness and dimension as known from the state of the art.

In a further variant, the distribution of the potentials may be realized using a "continuous interpolation". Then for each polarity of the potentials one layer of a resist material is provided instead of the conductor lines described above. The feeding potentials are applied to the lattice points Pij, and a varying potential will establish which interpolates the values at the feeding points. The potential can then be taken at any set of points in the sub-area Aij as needed for supplying the electrodes of the respective polarity. For the production of the resistive layers and the feedthroughs state-of-the-art lithography and etch techniques can be used.

FIG. 12 illustrates the function of the first adjustment unit 501. In the case that the illumination system 101 does not produce an exact telecentric beam, the beam will impinge at the cover plate 201 at an angle $\theta_1$ which will be dependent on the position of the beam on the plate (x-y-dependence). The adjustment unit 501 allows for a x-y-dependent compensation of the angle $\theta_1$, thus lifting the tolerance requirement with respect to telecentricity of the illuminating beam lb.

Furthermore, with the help of the adjustment unit 501 a mis-alignment of the PD plates can be compensated, in particular, a mis-alignment of the type where the openings belonging to the same aperture are aligned along an axis which is not exactly parallel to the z-axis, but at an angle $\theta_2$. Provided that the plates and the structures in them were defined in a corresponding manner, for instance using the same lithography tool for producing them, the relative position of the corresponding structures, in particular the openings 210, 220, 230 will match very well, i.e. with very low deviations of only a few nm. This allows to align the cover plate, blanking plate and aperture plate with respect to each other and to the particle beam in such a way that the particle beam exactly traverses the sequence of openings in the plates. The adjustment unit 501 compensates for a possible deviation of the (local) direction $\theta_1$ of the particle beam lb and the (local) direction $\theta_2$ of the stacking axis of the openings. The deviation of the stacking direction from the ideal orthogonality (running parallel to the z-axis) may be due to a tilting of the stack of plates, or due to a torsion of the stack around the z-axis.

Referring to FIG. 13, another adjustment unit 502 (of the same layout as the unit 501) may be positioned in front of the aperture plate 203. Its purpose is the reduction of geometric aberrations, such as image distortion, geometric blur (curvature of image plane) and astigmatic effects. It can also be used to modulate effects of space charge so that they can be corrected in combination with refocusing the particle beam. In order to obtain a high influence on the mentioned defects to be compensated, the adjustment unit 502 will be located at a distance to the object as small as possible, i.e. at a very small distance to the aperture 230 in the aperture plate 203.

In the device of FIG. 1, the angles of the beamlet trajectories converge into a cross-over c2 before being formed to an image of the aperture array at the substrate plane. Due to the lens properties, this crossover will in general be aberrated, i.e. trajectories starting at the PD system with the same orientation do not focus to one point but will rather form a spherical aberration disk. The global space charge influence onto the image stems to a great extent from Coulomb interactions in the vicinity of the second crossover c2. If this crossover is aberrated, the effect onto the image shape is not only a change of magnification but also additional distortion. Whereas the magnification change can be relatively easily corrected for by, e.g., changing the voltage of one or more electrode(s) in an electrostatic lens, the distortion caused by global space charge would cause additional blur in the final pattern on the substrate. With the aid of the adjustment unit 502 (FIG. 13), the angles of the beamlets are adjusted so as to minimize the aberration of the crossover. By this measure, also the field curvature aberration of the system is reduced, i.e. the optical performance of the system is improved. The adjustment unit 502 also accounts for the possibility that the trajectories do not run within meridional planes (planes through the optical axis cx); this may be the case in particular if axial symmetric magnetic fields are used in the projection system 103. Of course, if an adjustment unit 503 is present after the aperture plate 230 as well, the effect of that plate and of the adjustment unit 502 will have to be considered in conjunction.

A third type of adjustment unit 503 (of the same layout as the unit 501), also shown in FIG. 13, may be provided at a position after the aperture plate 203. This unit 503 serves to correct deviations of the actual transfer function of the imaging system from the nominal transfer function, which deviations may be due to various reasons such as production defects, calculational limits or alignment deficiencies or external influence (for instance, external electromagnetic fields). It can also be used to correct the distortion of the projection optical system. The adjustment unit 503 produces a virtual object 230' different from the object as defined by the aperture 230, which is imaged onto the substrate. As a consequence of its function, namely, to shift the position of the object to be imaged laterally to the position as needed with the transfer function onto the image position as desired at the substrate, the unit 503 must be arranged after the object, i.e., after the aperture plate 203.

It should be noted that for the case that the trajectories will not deviate from the respective meridional planes, it will be sufficient to provide the adjustment units 501, 502 with a radial deflector arrangement only, rather than with a pair of deflectors. Then the deflectors will be realized with deflector plates oriented along rings running around the optical axis.

FIG. 14 shows an illustration of this 'radial' variant. The deflector electrodes are then oriented perpendicular to the radial direction ('tangential' direction), in order to ensure a radial deflection of the particles. The potential then has to vary in radial direction. Consequently, a partitioning into concentric ring-shaped sub-areas Ai (i=1, . . . n) is appropriate which surround the optical axis cx. For each of the sub-areas Ai, ring lines are provided for supplying the respective electrostatic potentials. The electrostatic potentials are generated, for instance, in the DAC D2 from digital data, and fed to the electrodes belonging to the rings Ai through the respective ring lines. Between the ring lines, the variation of the potential can again be constant, linear interpolated by means of, e.g., a resist array or a continuous interpolation with a resist layer. FIG. 15 shows a detail of a layout of the conductor lines with a resist array for a linear interpolation for a ring Ai and a portion of ring A(i+1).

We claim:

1. A device (102) for defining a pattern, for use in a particle-beam exposure apparatus (100), said device adapted to be irradiated with a beam (lb) of electrically charged particles and allow the passage of the beam (pb) only through a plurality of apertures, comprising an aperture array means (203) having a plurality of apertures (21, 230) defining the shape of beamlets (bm) permeating said apertures and at least one deflector array means (501, 502, 503) separate from the aperture array means (203), said deflector array means (501, 502, 503) having a plurality of openings (250) surrounding the beamlets (bm), wherein for each opening or group of openings are provided at least two deflecting electrodes (ea1, ea2; eb1, eb2) to which different electrostatic potentials are applicable, thus correcting the path of the beamlet(s) passing through the respective opening according to a desired path through the device (102), wherein, according to a partition of the plurality of apertures (21, 230) into a set of subfields (Aij), the deflecting electrodes belonging to the same subfield (Aij) have common electric supplies.

2. The device of claim 1, wherein the electrostatic potentials of the deflecting electrodes belonging to the same subfield (Aij) are interpolated between basic potentials fed at basic points (Pij) of the respective subfield.

3. The device of claim 2, wherein corresponding deflecting electrodes belonging to the same subfield (Aij) are connected to two potentials, the connection being realized as an array of conductors with a predefined resistance between the electrodes.

4. The device of claim 1, wherein the electrostatic potentials of the deflecting electrodes belonging to the same subfield (Aij) are equal to basic potentials fed at basic points (Pij) of the respective subfield.

5. The device of claim 1, wherein each opening (250) of the deflector array means is provided with at least one pair of deflecting electrodes (ea1, ea2; eb1, eb2).

6. The device of claim 1, wherein electrode pairs are arranged along respective openings which each correspond to a plurality of beamlets and are aligned along straight lines.

7. The device of claim 1, wherein the deflector array means comprises at least one plate (50a, 50b), wherein corresponding deflecting electrodes are formed on the same plate.

8. The device of claim 1, wherein the deflector array means (501, 502, 503) comprises two plates (50a, 50b), each plate having the same plurality of openings (250), wherein in each plate the openings are provided with a pair of deflecting electrodes, the orientation of the electrodes (ea1, ea2) of the first of the plates being at an angle to the orientation of the electrodes (eb1, eb2) of the second of the plates.

9. The device of claim 8, wherein the deflecting electrodes are arranged in lines following the closest or second closest distance between the apertures.

10. The device of claim 8, wherein the angle between the orientations of the electrodes is different from 90°.

11. The device of claim 1, wherein the openings are provided with pairs of electrodes arranged along circles around the optical axis (FIG. 15).

12. The device of claim 11, wherein corresponding deflecting electrodes belonging to the same subfield (Aij) are connected to two potentials, the connection being realized as an array of conductors with a predefined resistance between the electrodes.

13. The device of claim 1, wherein the electrodes are arranged along openings which each correspond to a plurality of beamlets (FIG. 8).

14. The device of claim 1, comprising a deflector array means (501) which is adapted to adjust the angles of the beamlets passing the apertures (bm) to correct for a deviation of the incoming beam from a desired homo- or telecentricity.

15. The device of claim 14, comprising several plates (22) having corresponding plurality of openings, wherein said deflector array means (501) is positioned immediately after the first plate of the device.

16. The device of claim 1, comprising a deflector array means (502) which is adapted to adjust the angles of the beamlets passing the apertures (bm) to minimize the aberration of a crossover formed in a projection optics after said device in the particle-beam exposure apparatus (100).

17. The device of claim 16, wherein said deflector array means (502) is positioned immediately before the aperture array means.

18. The device of claim 1, comprising a deflector array means (503) which is adapted to produce a virtual object (203') different from the object as defined by the apertures (230) of the aperture array means.

19. The device of claim 1, comprising a first deflector array means (502) which is adapted to adjust the angles of the beamlets passing the apertures (bm) to minimize the aberration of a crossover formed in a projection optics after said device in the particle-beam exposure apparatus (100), a second deflector array means (503) which is adapted to produce a virtual object (203') different from the object as defined by the apertures (230) of the aperture array means, said first and second deflector array means (502, 503) adapted to adjust the position of the virtual object (230') and the angles of the beamlets independently from each other.

* * * * *